(12) United States Patent
McLaughlin et al.

(10) Patent No.: US 6,982,483 B2
(45) Date of Patent: Jan. 3, 2006

(54) HIGH IMPEDANCE RADIO FREQUENCY POWER PLASTIC PACKAGE

(75) Inventors: Robert J. McLaughlin, Phoenix, AZ (US); Alexander J. Elliott, Tempe, AZ (US); Mall Mahalingam, Scottsdale, AZ (US); Scott D. Marshall, Chandler, AZ (US); Pierre-Marie J. Piel, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/448,548

(22) Filed: May 30, 2003

(65) Prior Publication Data

US 2004/0241913 A1 Dec. 2, 2004

(51) Int. Cl.
*H01L 23/34* (2006.01)

(52) U.S. Cl. ......................... 257/728; 257/701
(58) Field of Classification Search .............. 257/701, 257/728
See application file for complete search history.

(56) References Cited

U.S. PATENT DOCUMENTS

| | | | | |
|---|---|---|---|---|
| 5,768,109 A | * | 6/1998 | Gulick et al. | 361/794 |
| 6,271,579 B1 | * | 8/2001 | Going et al. | 257/664 |
| 6,570,445 B1 | * | 5/2003 | Perrin et al. | 330/149 |
| 6,570,469 B2 | * | 5/2003 | Yamada et al. | 333/193 |
| 2002/0167060 A1 | * | 11/2002 | Buijsman et al. | 257/423 |
| 2003/0128080 A1 | * | 7/2003 | Viswanathan et al. | 333/125 |
| 2004/0026766 A1 | * | 2/2004 | Schmitz et al. | 257/662 |
| 2004/0080917 A1 | * | 4/2004 | Steddom et al. | 361/748 |

OTHER PUBLICATIONS

Estes et al., An internally matched LTCC 3G W–CDMA 180 watt LDMOS power amplifier, IEEE Microwave Symposium Digest, (May 2001) 1357.*

* cited by examiner

*Primary Examiner*—Christian Wilson
(74) *Attorney, Agent, or Firm*—Toler, Larson & Abel, LLP

(57) ABSTRACT

The disclosures made herein relate to RF power semiconductor devices. In accordance with one embodiment of the disclosures made herein, a RF power plastic semiconductor device comprises a semiconductor (RF) device, a Low Temperature Co-Fired Ceramic (LTCC) impedance matching structure electrically connected to the RF device and a plastic package body formed over the RF device and the impedance matching structure. The LTCC impedance matching structure comprises a metallized layer overlying a major body portion of the impedance matching structure and comprises a passivation layer on the metallized layer. The passivation layer enhances bond strength of a mold compound of the plastic package body to the metallized layer. Portions of the metallized layer are exposed through the passivation layer for enabling electrical interconnects to be formed between the LTCC impedance matching structure and the RF device. Preferably, RF power plastic packages in accordance with embodiments of the disclosures made herein exhibit terminal impedance of at least about twice that of conventional RF power plastic packages.

23 Claims, 2 Drawing Sheets

HIGH IMPEDANCE RADIO FREQUENCY POWER PLASTIC PACKAGE

FIELD OF THE DISCLOSURE

The disclosures made herein relate generally to plastic packaged circuitry and more particularly to high impedance Radio Frequency (RF) power plastic packages.

BACKGROUND

Conventional RF power plastic packages exhibit one or more limitations. Examples of such limitations include, but are not limited to, relatively low terminal impedance, narrow band frequency performance, impedance matching limited to wire loop mechanisms and associated loop height control. In addition, using wires for matching structures has the potential to result in excessive wire temperature, which can adversely affect performance and reliability in a RF power plastic package.

Therefore, an RF power plastic package that overcomes limitations associated with conventional RF power plastic packages would be useful.

DETAILED DESCRIPTION OF THE DRAWINGS

The disclosures made herein relate to RF power plastic packages that exhibit higher terminal impedance relative to that of conventional RF power plastic packages. A plastic package including an RF signal amplifying device and a high impedance matching structure (e.g., a ceramic impedance matching structure) connected to the RF signal amplifying device is an embodiment of a high impedance RF power plastic package in accordance with the disclosures made herein. Amplifying (e.g., transforming) a signal and providing impedance matching are examples of facilitating signal conditioning.

RF power plastic packages in accordance with embodiments of the disclosures made herein are useful and advantageous in that they overcome limitations associated with conventional RF power plastic packages. Specifically, with respect to conventional RF power plastic packages, RF power plastic packages as disclosed herein provide internal impedance matching in a plastic packaged format, provide relatively high impedance levels, provide relatively flat performance over a broad frequency spectrum, provide desired reliability when packaged using known plastic packaging techniques, exhibit a relatively low unit cost and enable the matching structure to operate at relatively low temperatures.

Figure 1:
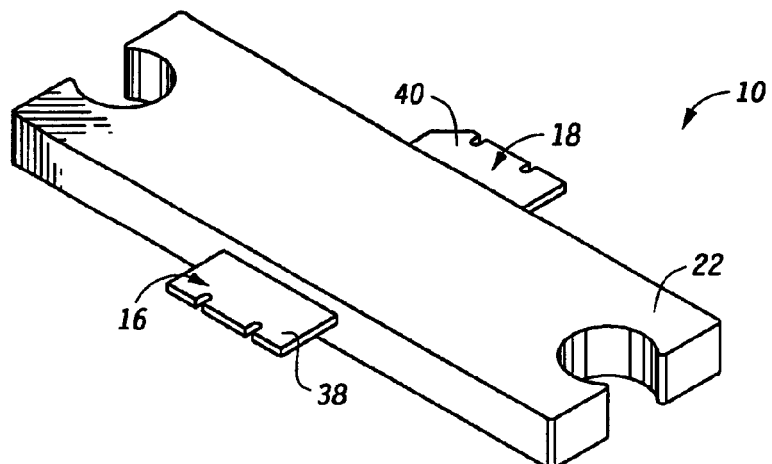
FIG. 1 depicts a high impedance RF power plastic package in accordance with an embodiment of the disclosures made herein.
Figure 2:
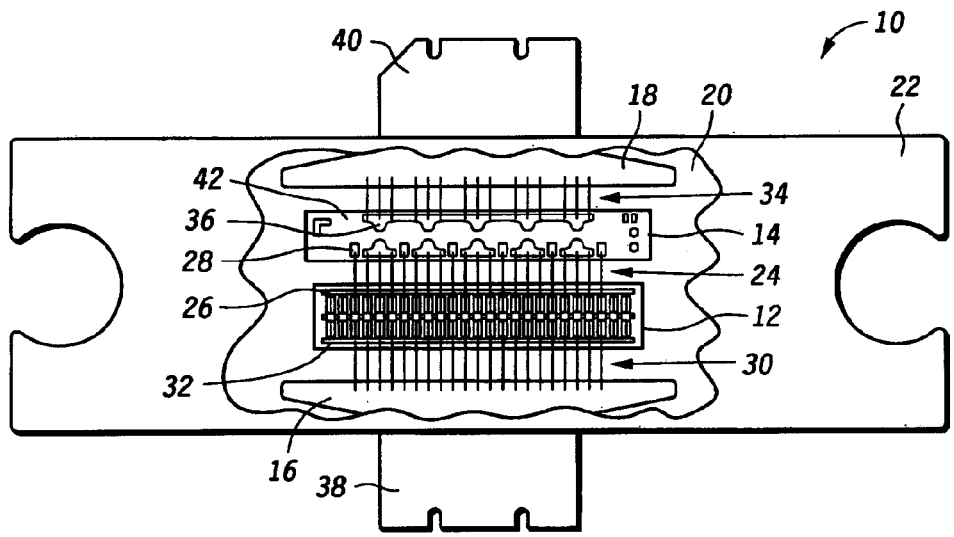
FIG. 2 depicts an embodiment of a circuitry arrangement of the high impedance RF power plastic package depicted in FIG. 1.
Figure 3:
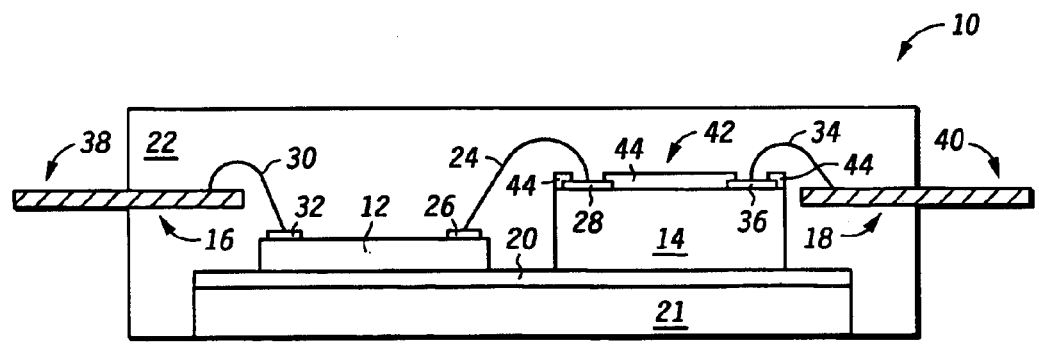
FIG. 3 depicts a cross sectional view of the high impedance RF plastic package depicted in FIG. 1.

Turning now to specific figures, a RF power plastic package 10 in accordance with an embodiment of the disclosures made herein is depicted in FIGS. 1–3. The RF power plastic package 10 includes a Laterally Diffused Metal Oxide Semiconductor (LDMOS) signal amplifier 12, a Low Temperature Co-Fired Ceramic (LTCC) impedance matching structure 14, a gate lead 16, a drain lead 18, a package substrate 20 and a plastic package body 22. Note that in the specific illustrated embodiment the package substrate 20 includes at least a portion of a lead frame (e.g. a component receiving area of the lead frame). Also illustrated is a heat sink 21 that is optional, and is illustrated to be coupled to the backside of the package substrate 20.

The LDMOS signal amplifier 12 and the LTCC impedance matching structure 14 jointly contribute to facilitating signal conditioning by the RF power plastic package 10. The LTCC impedance matching structure 14 is an embodiment of a structure configured for providing impedance matching functionality (i.e., an impedance matching structure). Preferably, RF power plastic packages in accordance with embodiments of the disclosures made herein exhibit terminal impedance of at least about twice that of conventional RF power plastic packages not having an impedance matching structure. For example, an RF power plastic package as disclosed herein, which comprises an LTCC impedance matching structure that exhibits an impedance resulting in a drain fixture impedance equal to or greater than about 1.5 ohms or more at about 100 watt peak envelope power, provides a significant improvement over conventional RF power packages without such matching structures. Specific embodiments of the RF power devices will provide a power output of about 5 or more watts, 10 or more watts, 20 or more watts, 50 or more watts, or about 100 watts or more. Specific embodiments will operate at frequencies of about 400 MHz or greater, 800 MHz or greater, 1 GHz or greater, 2 GHz or greater, 3 GHz or greater, or higher. In view of impedance levels exhibited by RF power plastic packages in accordance with embodiments of the disclosures made herein, such RF power plastic packages provide high-power, high-bandwidth RF power amplifier functionality that exhibit relatively flat electrical performance over a broad frequency spectrum. Furthermore, ceramic impedance matching structures as disclosed herein contribute to relatively low operating temperatures with respect to conventional impedance matching structures (e.g., wire loop mechanisms).

Implementation of various types of RF devices that enable RF signal transformation functionality is contemplated. Examples of such types of RF power devices include, for example, silicon, germanium, and gallium arsenide RF devices configured for enabling RF signal transforming functionality. Such devices may be MOS (metal oxide semiconductor) devices or bipolar devices, and are typically made using silicon or gallium arsenide. The LDMOS signal amplifier 12 is a specific example of an RF device that enables RF signal transforming functionality. A device adapted for providing such RF signal transforming functionality is an example of a RF signal transforming device.

Although implementation of LTCC impedance matching structures is depicted herein, RF power plastic packages in accordance with embodiments of the disclosures made herein that implement other types of impedance matching structures different than LTCC impedance matching structures are contemplated herein. Such other types of impedance matching include, but are not limited to, high dielectric ceramic impedance matching structures (e.g., titanates), organic impedance matching structures and MOSCAP (Metal Oxide Semiconductor Capacitor) impedance matching structures. Implementation of single and multi-layer impedance matching structures in RF power plastic packages as disclosed herein is also contemplated.

The LDMOS signal amplifier 12 and the LTCC impedance matching structure 14 are bonded to (i.e., mounted on) a first surface of the package substrate 20. The heat sink 21 is bonded to a second surface of the package substrate 20. It is contemplated herein that the impedance matching structure 14 may be bonded to the package substrate 20 using any number of known die bonding techniques. Examples of such known die bonding techniques include, but are not limited to, epoxy bonding and solder bonding techniques.

Various embodiments of the package substrate 20 are contemplated herein. In one embodiment, the package substrate 20, gate lead 16 and drain lead 18 are components excised from a common electrically conductive lead frame. In another embodiment of the package substrate 20, the package substrate 20, gate lead 16 and drain lead 18 are discrete electrically conductive components that are assembled with at least the gate lead 16 or the drain lead 18 being mounted on the package substrate 20 in an electrically insulated manner.

The LDMOS signal amplifier 12 is electrically connected to the LTCC impedance matching structure 14 through a first plurality of conductive interconnects 24. The first plurality of conductive interconnects 24 are connected between a drain bar 26 of the LDMOS signal amplifier 12 and one or more device contacts 28 of the LTCC impedance matching structure 14. The LDMOS signal amplifier 12 is electrically connected to the gate lead 16 through a second plurality of conductive interconnects 30. The second plurality of conductive interconnects 30 are connected between a gate bar 32 of the LDMOS signal amplifier 12 and the gate lead 16. The LTCC impedance matching structure 14 is electrically connected to the drain lead 18 through a third plurality of conductive interconnects 34. The third plurality of conductive interconnects 34 are connected between one or more drain lead contacts 36 of the LTCC impedance matching structure 14 and the drain lead 18. In one embodiment, the plurality of conductive interconnects 24, 30, and 34 are provided in the form of conductive wire bonds.

The LDMOS signal amplifier 12, the LTCC impedance matching structure 14, the package substrate 20 and the various pluralities of conductive interconnects (24, 30, 34) are encapsulated within the plastic package body 22. Portions of the gate lead 16 and the drain lead 18 having the respective plurality of conductive interconnects (30, 34) attached thereto are encapsulated within the plastic package body 22. A gate lead contact portion 38 and a drain lead contact portion 40 extend through the plastic package body 22 for enabling access thereto.

As depicted in FIGS. 2 and 3, the device contacts 28 and the lead contacts 36 of the LTCC impedance matching structure 14 are defined by portions of a metallized layer (not specifically denoted) overlying a top major body portion 42 of the impedance matching structure 14. In one embodiment, a passivation layer 44 (FIG. 3 only) is formed overlying the major body portion 42 of the LTCC impedance matching structure 14. Preferably, the passivation layer covers the entire top surface, including the metallized layer, except for areas of the metallized layer where interconnects (e.g., wire bonds) are needed. Known types of passivation layers such as, for example, a nitride passivation layer are contemplated.

The use of a passivation layer on the metallized layer overlying the major body portion 42 of the LTCC impedance matching structure 14 is a novel approach disclosed herein for improving adhesion of the plastic package body 22 (i.e., the mold compound of the plastic package body 22) to the LTCC impedance matching structure 14. It is known that plastic package mold compounds exhibit limited bond strength when formed over materials such as noble metals (e.g., gold, platinum and the like). Forming the passivation layer formed over a majority of the metallized layer overlying the major body portion 42 of the LTCC impedance matching structure 14 (e.g., with the exception of over areas of the metallized layer where interconnects (e.g., wire bonds) are needed) reduces the area of the metallized layer that is exposed to direct contact with the plastic package body. Accordingly, bond strength between the plastic package body 22 and the LTCC impedance matching structure 14 is enhanced.

Improving bond strength between the plastic package body 22 and the LTCC impedance matching structure 14 contributes to a reduced potential for delaminating of the plastic package body 22 from the major impedance matching structure 14. In this manner, the passivation layer contributes to improving the Moisture Sensitivity Level (MSL) performance rating of RF power plastic packages in accordance with embodiments of the disclosures made herein. Furthermore, when the passivation layer is formed overlying the major body portion 42 of the LTCC impedance matching structure 14, the passivation layer also serves as a protective layer to the underlying portions of the LTCC impedance matching structure 14.

Figure 4:
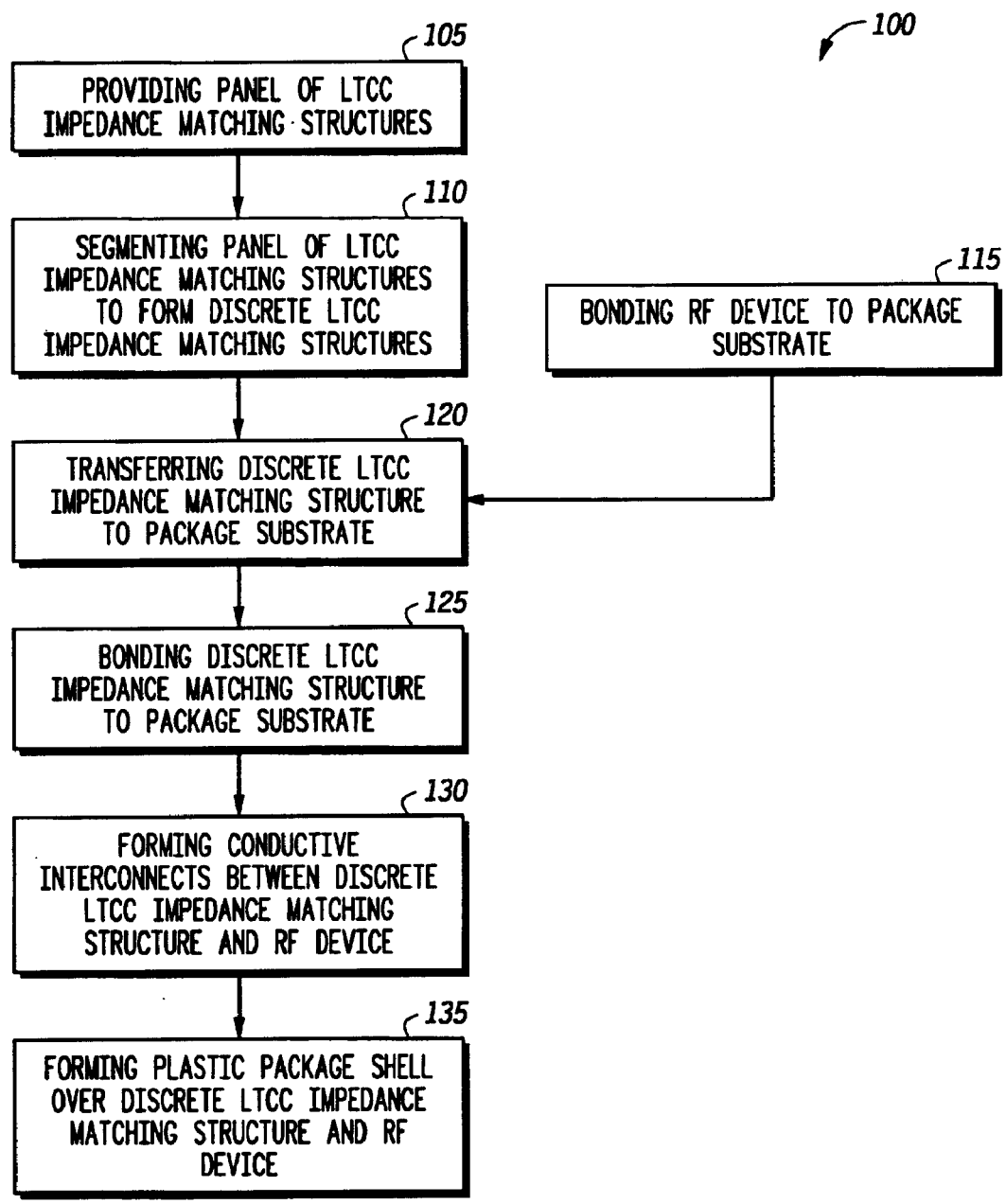
FIG. 4 depicts a method for producing a high impedance RF power plastic package in accordance with an embodiment of the disclosures made herein.

Referring to FIG. 4, a method 100 for fabricating RF power plastic packages in accordance with an embodiment of the disclosures made herein is depicted. An operation 105 is performed for providing a panel of LTCC impedance matching structures. The panel includes an array (i.e., a plurality) of LTCC impedance matching structures, which are joined to each other as-fired. Examples of providing the panel of LTCC impedance matching structures include fabricating the panel and procuring the panel from a fabricator.

In at least one embodiment of providing the panel of LTCC impedance matching structures, the LTCC impedance matching structures of the provided panel include a passivation layer formed overlying a metallized layer that itself overlies a top major body portion of the LTCC impedance matching structures and only areas of the metallized layer where interconnects (e.g., wire bonds) are needed are exposed through the passivation layer. After the panel of LTCC impedance matching structures is provided, an operation 110 is performed for segmenting the panel of LTCC impedance matching structures to produce a plurality of discrete LTCC impedance matching structures. Sawing the panel of LTCC impedance matching structures mounted on a film frame using automated wafer saw equipment, such as is used to partition semiconductor die, is an example of segmenting the panel. After the panel of LTCC impedance matching structure is segmented and after an operation 115 is performed for bonding an RF device to a package substrate (e.g., a conductive lead frame), an operation 120 is performed for transferring a discrete LTCC impedance matching structure to the package substrate. Picking the discrete LTCC impedance matching structure from a film frame (i.e., a processing support substrate) and placing the discrete LTCC impedance matching structure on the package substrate using automated packaging equipment is an example of the operation 120 for transferring the discrete LTCC impedance matching structure to the package substrate.

After transferring the discrete LTCC impedance matching structure to the package substrate, an operation 125 is performed for bonding the discrete LTCC impedance matching structure to the package substrate, followed by an operation 130 for forming conductive interconnects (e.g., wire bonds) between the discrete LTCC impedance matching structure and the RF device. Thereafter, an operation 135 is performed for forming a plastic package body over the LTCC impedance matching structure and the RF device after forming the conductive interconnects. A transfer molding process is an example of a known technique for molding a mold compound to form the plastic package body.

Preferably, as depicted in FIG. 4, the operation 115 for bonding the RF device to the package substrate is performed prior to performing the operation 125 for bonding the discrete LTCC impedance matching structure to the package substrate. However, it is contemplated herein that in other embodiments of the method 100 (not shown), the operation 115 of bonding the RF device is performed after the operation 125 for bonding the LTCC impedance matching structure to the package substrate is performed.

In one specific embodiment of the method 100, circuitry of the RF power plastic package is assembled advantageously using semiconductor process equipment. Furthermore, the RF device and the LTCC impedance matching structure of the RF power plastic package are advantageously mounted on a lead frame rather than the LTCC impedance matching structure being mounted on substrate such as a FR-4 printed circuit substrate. In this specific embodiment, the panel of LTCC impedance matching structures is mounted on a film frame or suitable adhesive tape and segmentation of the panel is performed by sawing the panel using commercially available wafer saw equipment, such as that used to partition semiconductor dies. The film frame or tape is selected to be thick enough so that it may be sawn to, rather than sawn through, thus enabling the film frame or adhesive tape to be used as a carrier substrate for subsequent processing operations. Sawing parameters such as feed rate, blade type and film frame thickness are tailored as necessary (e.g., dependent upon hardness and thickness of the panel) to achieve desired results. After the panel is sawn, a discrete LTCC impedance matching structure is transferred directly from the film frame or adhesive tape to and is bonded to a conductive lead frame, which resides on semiconductor die bond equipment. The discrete LTCC impedance matching structure is transferred using automated pick and place semiconductor process equipment/techniques. After the LTCC impedance matching structure and the RF device are mounted on the lead frame, one or more electrical interconnects (e.g., wire bonds) are formed between each of the RF device, LTCC impedance matching structure and lead frame using semiconductor wirebond equipment.

Segmenting a panel of LTCC impedance matching structures using commercially available wafer saw equipment and transferring the resulting discrete LTCC impedance matching structures directly from a film frame or adhesive tape to a conductive substrate using automated pick and place semiconductor process equipment/techniques is a novel and advantageous approach for segmenting and handling discrete LTCC impedance matching structures. Conventional approaches for segmenting panels of LTCC impedance matching structures include scribing and breaking panels, segmenting panels before firing them, and cutting fired panel after being mounted on glass followed by removing each discrete LTCC impedance matching structure from a respective cut piece of glass. Each of these approaches for segmenting panels of LTCC impedance matching structures exhibits one or more limitations as compared to sawing panels using wafer saw equipment as disclosed herein. Examples of such limitations include being dependent upon specialized LTCC processing equipment, exhibiting relatively low yield, and/or being an expensive approach for segmenting LTCC impedance matching panels. Conventionally, discrete LTCC impedance matching structures are mounted on an interposer substrate (e.g., a FR4 printed circuit substrate) and are shipped in a tape and reel format. In view of the disclosures made herein, handling discrete LTCC impedance matching structures mounted on a lead frame using tape and reel approach would be expensive and impractical.

Preferably, the operations of segmenting, transferring, bonding, forming the conductive interconnects and forming plastic packages are performed using commercially-available equipment, which may be modified or unmodified. Examples of such commercially available equipment include wafer sawing machines, die bond machines, solder reflow ovens, epoxy curing ovens and wire bond machines.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical, mechanical, chemical and electrical changes may be made without departing from the spirit or scope of the invention. In addition, it will be appreciated that the functional blocks shown in the figures could be further combined or divided in a number of manners without departing from the spirit or scope of the invention. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A semiconductor device, comprising:
   a Radio Frequency (RF) device;
   a Low Temperature Co-Fired Ceramic (LTCC) impedance matching structure electrically connected to the RF device; and
   a plastic package body formed over the RF device and the impedance matching structure.

2. The device of claim 1 wherein the RF device is a signal transforming device.

3. The device of claim 2 wherein the signal transforming device is a RF signal amplifying device.

4. The device of claim 1 wherein the impedance matching structure enables a drain fixture impedance equal to or greater than about 1.5 ohms at about 100 watt peak envelope power.

5. The device of claim 1:
   wherein the LTCC impedance matching structure comprises a metallized layer overlying a major body portion thereof; and
   further comprising a passivation layer formed over the metallized layer.

6. The device of claim 5 wherein the RF device is a signal transforming device.

7. The device of claim 6 wherein the signal transforming device is a RF signal amplifying device.

8. The device of claim 5 wherein:
   portions of the metallized layer are exposed through the passivation layer; and
   said portions are used to interconnect the LTCC impedance matching structure to corresponding contacts of the device.

9. The device of claim 1, further comprising:
a lead frame component having the impedance matching structure mounted thereon.

10. A semiconductor device, comprising:
a Radio Frequency (RF) device;
a Low Temperature Co-Fired Ceramic (LTCC) impedance matching structure electrically connected to the RF device, wherein the LTCC impedance matching structure comprises a metallized layer overlying a major body portion thereof and a passivation layer on the metallized layer; and
a plastic package body formed over the RF device and the LTCC impedance matching structure.

11. The device of claim 10 wherein the RF device is a signal transforming device.

12. The device of claim 10 wherein portions of the metallized layer are exposed through the passivation layer to provide electrical interconnects to be formed between the LTCC impedance matching structure and the RF device.

13. The device of claim 10 wherein:
the RF device is a RF signal amplifying device;
the LTCC impedance matching structure enables a drain fixture impedance equal to or greater than about 1.5 ohms at about 100 watt peak envelope power; and
portions of the metallized layer are exposed through the passivation layer to provide electrical interconnects to be formed between the LTCC impedance matching structure and the RF device.

14. The device of claim 13, further comprising:
a lead frame component comprising the LTCC impedance matching structure mounted thereon.

15. The device of claim 10, further comprising:
a plastic package body formed over the RF device and the LTCC impedance matching structure.

16. A semiconductor device, comprising:
a Radio Frequency (RF) device;
an impedance matching structure electrically connected to the RF device; and
a plastic package body encapsulating the RF device and the impedance matching structure;
wherein the impedance matching structure comprises at least one of a Low Temperature Co-Fired Ceramic (LTCC) impedance matching structure, a high dielectric ceramic impedance matching structure, or an organic structure.

17. The device of claim 16:
wherein the impedance matching structure comprises a metallized layer overlying a major body portion thereof; and
further comprising a passivation layer formed over the metallized layer.

18. The device of claim 16 wherein the RF device is a signal transforming device.

19. The device of claim 18 wherein the signal transforming device is a RF signal amplifying device.

20. A semiconductor device, comprising:
a Radio Frequency (RF) device;
an impedance matching structure electrically connected to the RF device, wherein the impedance matching structure enables a drain fixture impedance equal to or greater than about 1.5 ohms at about 100 watt peak envelope power; and
a plastic package body formed over the RF device and the impedance matching structure.

21. A semiconductor device, comprising:
a Radio Frequency (RF) device;
a high dielectric ceramic impedance matching structure electrically connected to the RF device; and
a plastic package body formed over the RF device and the impedance matching structure.

22. A semiconductor device, comprising:
a Radio Frequency (RF) device;
an organic impedance matching structure electrically connected to the RF device; and
a plastic package body formed over the RF device and the impedance matching structure.

23. A semiconductor device, comprising:
a Radio Frequency (RF) device;
an impedance matching structure electrically connected to the RF device;
a lead frame component having the impedance matching structure mounted thereon; and
a plastic package body formed over the RF device and the impedance matching structure; wherein the impedance matching structure comprises at least one of a Low Temperature Co-Fired Ceramic (LTCC) impedance matching structure, a high dielectric ceramic impedance matching structure, or an organic structure.

* * * * *